(12) United States Patent
Manning et al.

(10) Patent No.: US 7,846,798 B2
(45) Date of Patent: Dec. 7, 2010

(54) METHODS OF FORMING VERTICAL TRANSISTOR STRUCTURES

(75) Inventors: H. Montgomery Manning, Eagle, ID (US); Kunal R. Parekh, Boise, ID (US); Cem Basceri, Reston, VA (US); Gurtej S. Sandhu, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 293 days.

(21) Appl. No.: 11/486,512

(22) Filed: Jul. 13, 2006

(65) Prior Publication Data

US 2006/0258086 A1 Nov. 16, 2006

Related U.S. Application Data

(62) Division of application No. 10/928,467, filed on Aug. 26, 2004, now abandoned.

(51) Int. Cl.
*H01L 21/336* (2006.01)

(52) U.S. Cl. .................. 438/268; 438/270; 438/525; 257/E21.41

(58) Field of Classification Search ............. 438/302, 438/270, 272, 268, 525; 257/E21.41
See application file for complete search history.

(56) References Cited

U.S. PATENT DOCUMENTS

| | | | |
|---|---|---|---|
| 5,106,775 A | 4/1992 | Kaga et al. ............. 437/52 |
| 5,177,027 A * | 1/1993 | Lowrey et al. ............. 438/270 |
| 5,214,301 A | 5/1993 | Kosa et al. ............. 257/329 |
| 5,270,239 A | 12/1993 | Min et al. ............. 437/52 |
| 5,302,843 A | 4/1994 | Yamazaki | |
| 5,312,767 A * | 5/1994 | Shimizu et al. ............. 438/268 |
| 5,391,506 A | 2/1995 | Tada et al. | |
| 5,598,037 A | 1/1997 | Kikuchi et al. | |
| 5,869,378 A | 2/1999 | Michael | |
| 5,891,773 A * | 4/1999 | Saitoh ............. 438/259 |
| 6,077,745 A | 6/2000 | Burns, Jr. et al. | |
| 6,096,596 A | 8/2000 | Gonzalez | |
| 6,107,133 A | 8/2000 | Furukawa et al. | |
| 6,414,347 B1 | 7/2002 | Divakaruni et al. | |
| 6,440,793 B1 | 8/2002 | Divakaruni et al. | |
| 6,740,920 B2 | 5/2004 | Chidambarrao et al. | |
| 6,841,438 B2 | 1/2005 | Bissey et al. | |
| 7,011,998 B1 | 3/2006 | Ju et al. | |
| 2002/0197781 A1 | 12/2002 | Bryant et al. | |
| 2003/0032229 A1 * | 2/2003 | Roberts ............. 438/200 |
| 2003/0082875 A1 | 5/2003 | Lee | |

* cited by examiner

*Primary Examiner*—Michael Trinh
(74) *Attorney, Agent, or Firm*—Wells St. John, P.S.

(57) ABSTRACT

The invention includes methods in which an angled implant is utilized to self-align a source/drain region implant with the top edge of a gateline of a vertical transistor structure. The invention also includes methods in which an angled implant is utilized to implant dopant beneath the gateline of a vertical transistor structure. Vertical transistor structures formed in accordance with methodology of the present invention can be incorporated into various types of integrated circuitry, including, for example, DRAM arrays.

14 Claims, 4 Drawing Sheets

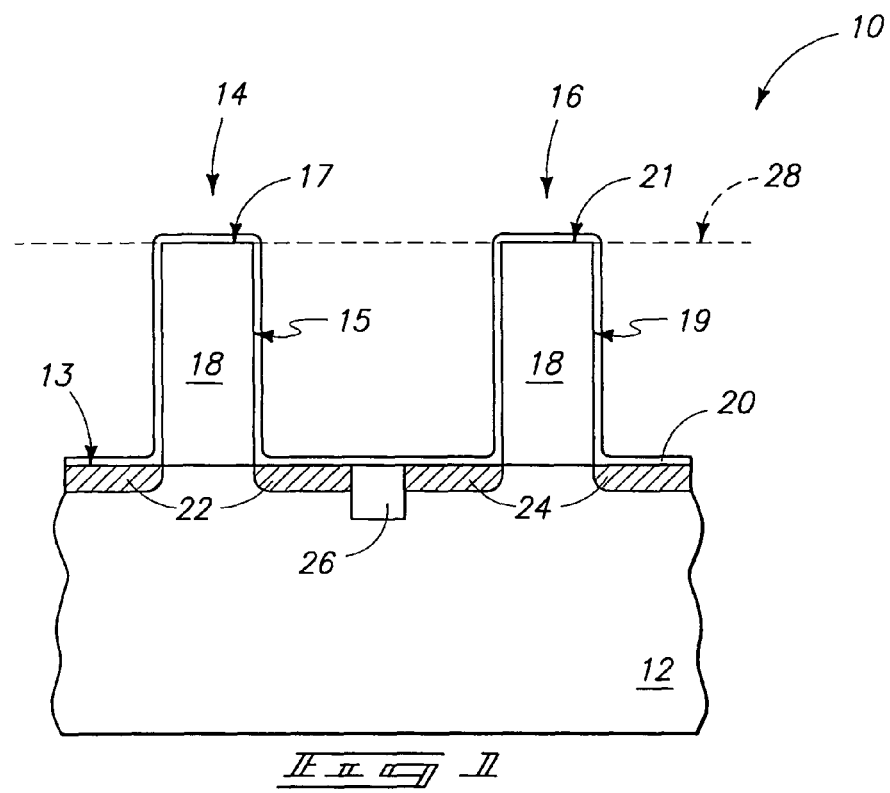
_Fig. 1_
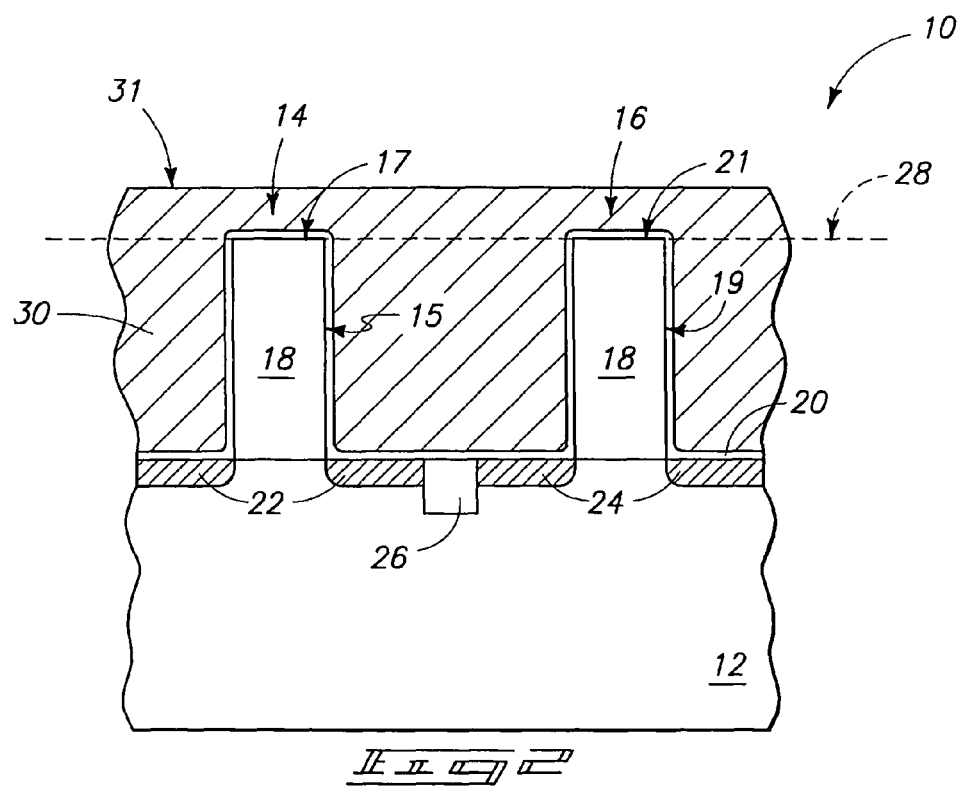
_Fig. 2_

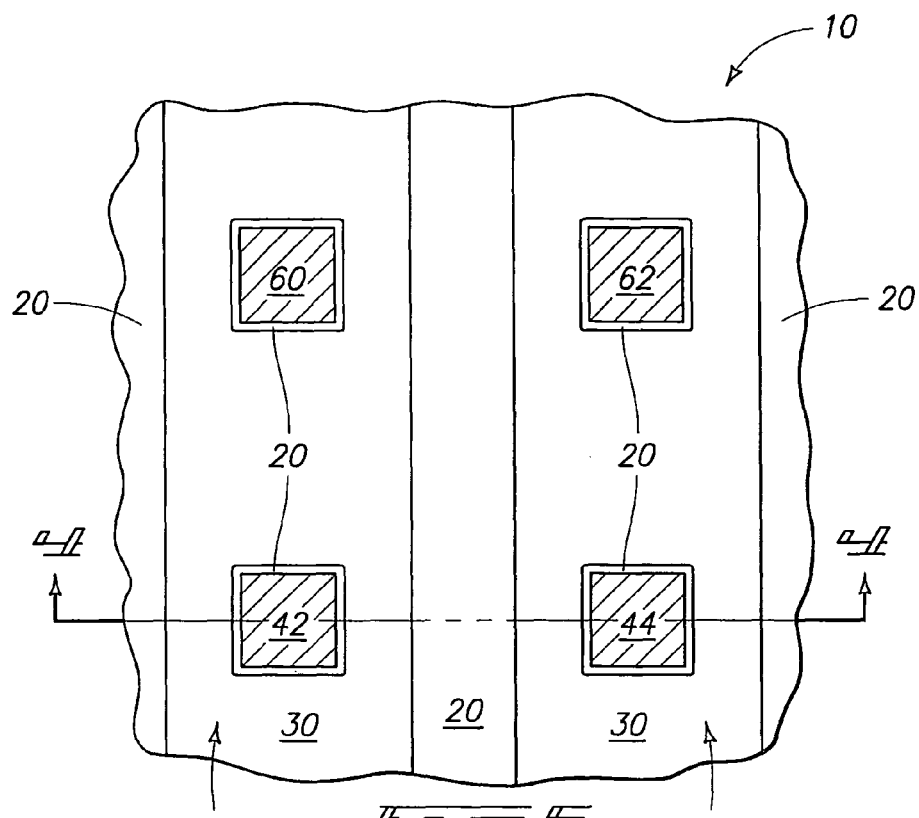
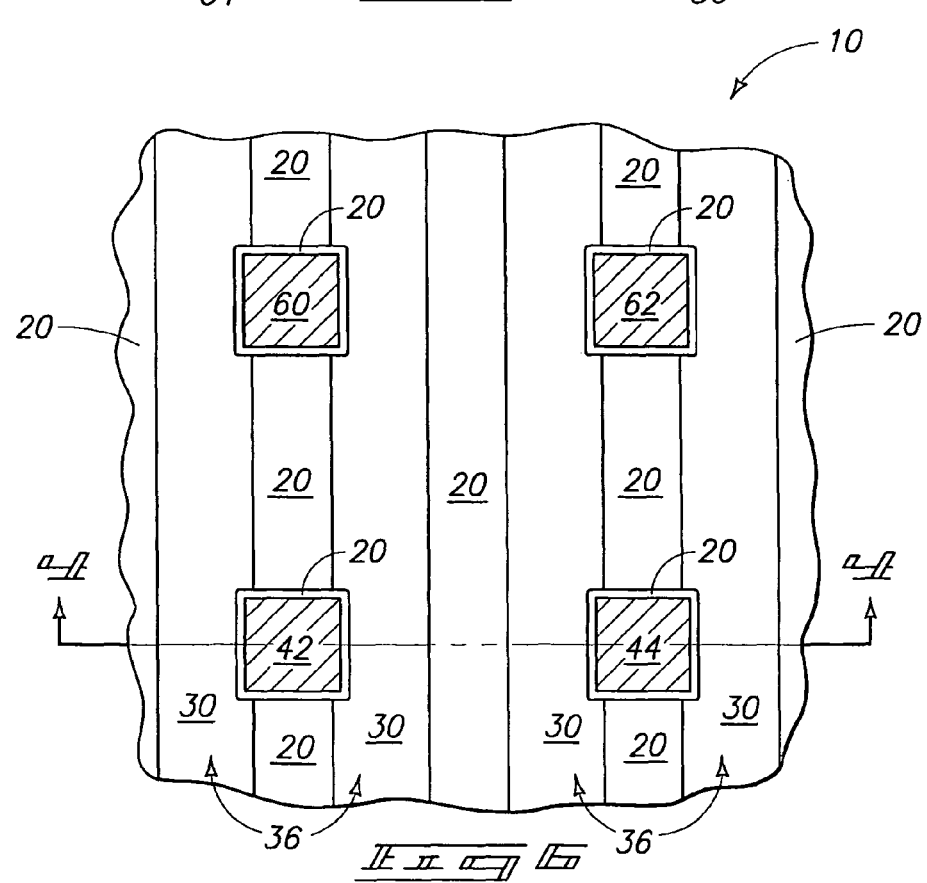

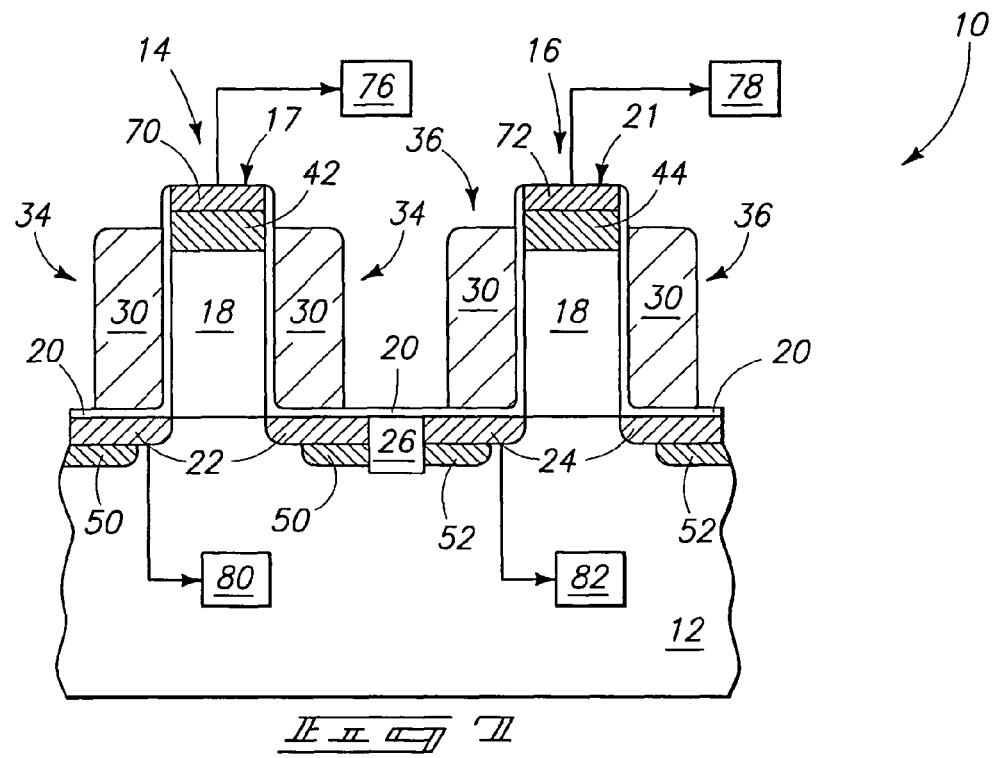
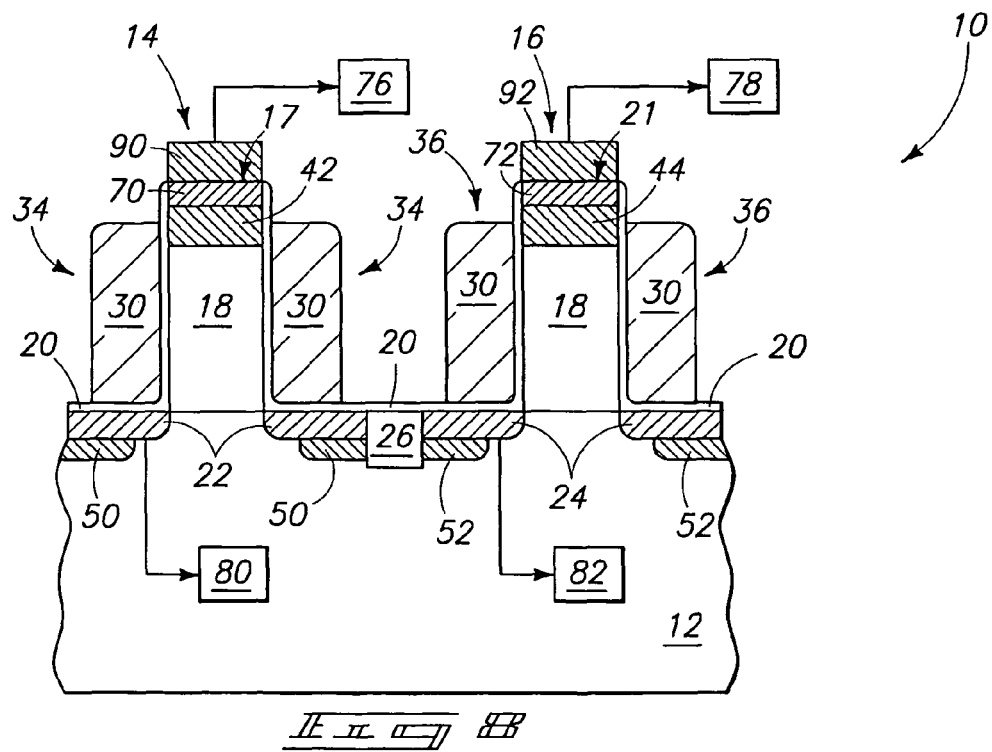

US 7,846,798 B2

METHODS OF FORMING VERTICAL TRANSISTOR STRUCTURES

RELATED PATENT DATA

This patent resulted from a divisional application of U.S. patent application Ser. No. 10/928,467, which was filed Aug. 26, 2004 now abandoned; and which is hereby incorporated by reference.

TECHNICAL FIELD

The invention pertains to methods of forming vertical transistor structures.

BACKGROUND OF THE INVENTION

Transistor structures have numerous applications for semiconductor circuitry. For instance, transistor structures can be incorporated into memory (such as, for example, dynamic random access memory (DRAM)) and logic circuitry. DRAM circuitry usually includes an array of memory cells interconnected by rows and columns, which are known as wordlines and bitlines, respectively. A typical DRAM memory cell comprises a transistor structure connected with a charge storage device (such as, for example, a capacitor).

Transistor structures comprise a channel region between a pair of source/drain regions, and a gate configured to electrically connect the source/drain regions to one another through the channel region. The transistor constructions utilized in semiconductor constructions will be supported by a semiconductor substrate. The semiconductor substrate will have a primary surface which can be considered to define a horizontal direction. Transistor devices can be divided amongst two broad categories based upon the orientations of the channel regions relative to the primary surface of the semiconductor substrate. Specifically, transistor structures which have channel regions that are primarily parallel to the primary surface of the substrate are referred to as planar transistor structures, and those having channel regions which are generally perpendicular to the primary surface of the substrate are referred to as vertical transistor structures. Since current flow between the source and drain regions of a transistor device occurs through the channel region, planar transistor devices can be distinguished from vertical transistor devices based upon the direction of current flow as well as on the general orientation of the channel region. Specifically, vertical transistor devices are devices in which the current flow between the source and drain regions of the devices is primarily substantially orthogonal to a primary surface of a semiconductor substrate, and planar transistor devices are devices in which the current flow between source and drain regions is primarily parallel to the primary surface of the semiconductor substrate.

There is continuing interest in the development of methodologies by which vertical transistor devices can be incorporated into integrated circuitry applications due to, among other things, advantages in packing density that can be obtained utilizing vertical transistor devices relative to planar transistor devices. Difficulties are frequently encountered in attempting to produce the vast arrays of vertical transistor devices desired for semiconductor applications while maintaining suitable performance characteristics of the devices.

Accordingly, it is desired to develop new methods for fabricating vertical transistor devices.

SUMMARY OF THE INVENTION

The invention includes methodology which can be utilized to self-align a source/drain implant with a gateline edge of a vertical transistor structure.

In one aspect, the invention encompasses a method of forming a vertical transistor structure. A construction is provided which has a vertically-extending pillar over a semiconductor substrate. The construction also has a gateline over the substrate and adjacent the pillar, with the top surface of the gateline being elevationally below a top surface of the pillar. A dopant is implanted at an angle that is at least 5° from vertical to form a source/drain implant region within the pillar that is aligned relative to the top surface of the gateline.

In one aspect, the invention includes a method of forming a vertical transistor structure in which a dopant is implanted at an angle that is at least 5° from vertical to form a source/drain implant region beneath a gateline of the structure.

In one aspect, the invention encompasses a method of forming a plurality of vertical transistor structures. A construction is provided which has a plurality of vertically-extending pillars over a monocrystalline substrate. The pillars have sidewall edges, and also have top surfaces at or above a first elevational height. A dielectric material is formed along the sidewall edges of the pillars. Gateline material is formed over the substrate and adjacent the pillars. The gateline material is spaced from the pillars by the dielectric material. The gateline material has a top surface at or above the first elevational height. The gateline material is recessed so that the top surface of the gateline material is below the first elevational height. A dopant is implanted at an angle that is at least 5° from vertical to form source/drain implant regions within the pillars, with the source/drain implant regions being aligned relative to the top surface of the recessed gateline.

BRIEF DESCRIPTION OF THE DRAWINGS

Preferred embodiments of the invention are described below with reference to the following accompanying drawings.

FIG. 1 is a diagrammatic, cross-sectional fragmentary view of a semiconductor construction at a preliminary processing stage of an exemplary aspect of the present invention.

FIG. 2 is a view of the FIG. 1 fragment shown at a processing stage subsequent to that of FIG. 1.

FIG. 5 is a top view of an exemplary semiconductor structure along the line 5-5 of FIG. 4, and comprising the cross-section of FIG. 4 along the line 4-4.

FIG. 6 is a top view of another exemplary semiconductor structure comprising the cross-section of FIG. 4 along the line 4-4, with the structure of FIG. 6 being an alternative embodiment relative to that of FIG. 5.

FIG. 7 is a view of the FIG. 1 fragment shown at a processing stage subsequent to that of FIG. 4.

FIG. 8 is a view of the FIG. 1 fragment shown at a processing stage subsequent to that of FIG. 4 in accordance with an exemplary aspect of the invention alternative to that of FIG. 7.

DETAILED DESCRIPTION OF THE PREFERRED EMBODIMENTS

Figure 3:
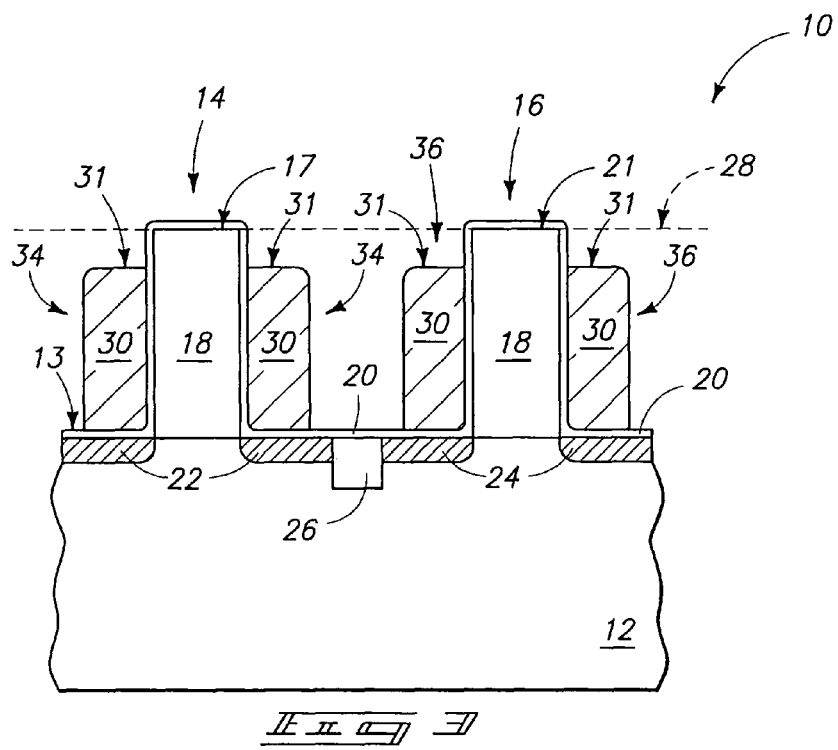
FIG. 3 is a view of the FIG. 1 fragment shown at a processing stage subsequent to that of FIG. 2.

This disclosure of the invention is submitted in furtherance of the constitutional purposes of the U.S. Patent Laws "to promote the progress of science and useful arts" (Article 1, Section 8).

A challenge confronted in the design of vertical transistor structures involves the difficulty of aligning source/drain regions of the structures with gate edges. Vertical transistor devices will frequently comprise a pillar of semiconductive material having an upper portion where a source/drain is to be formed, and having a middle portion where a channel region is to be formed. The transistor devices will also comprise a gateline adjacent the pillar and having an uppermost edge which is to be aligned relative to the interface of the channel region and upper source/drain region within the pillar. The amount of overlap between the gateline and the source/drain region can significantly influence performance characteristics of a transistor device. If there is too much overlap between the source/drain and the gateline, capacitive effects between the source/drain and gateline will become problematic and/or gate-induced drain leakage will become problematic. If there is too little overlap, there will not be an adequate connection to the source/drain region of the transistor device and reliability will be degraded.

The problems of aligning source/drain region implants within vertical pillars of vertical transistor structures can be exacerbated by physical variations that can exist amongst a population of pillars associated with a semiconductor substrate. For instance, there will typically be a variation in height amongst the pillars, and further there will be a variation in height of the gateline material extending along the pillars. Accordingly, if source/drain regions are all provided to be the same depth amongst the pillars, there will likely be some source/drain regions which are too deep and others which are too shallow within the population of transistor structures that is being formed.

In some aspects, the present invention addresses the above-discussed challenge of forming source/drain regions for vertical transistor structures by providing methodology which can self-align the source/drain regions to the top edge of a gateline of a vertical transistor device.

Exemplary aspects of the invention are described with reference to FIGS. 1-8.

Referring initially to FIG. 1, a semiconductor construction 10 comprises a substrate 12 having a primary surface 13 which defines a horizontal direction. Substrate 12 can comprise, consist essentially of, or consist of a monocrystalline semiconductor material, and in particular aspects will comprise, consist essentially of, or consist of monocrystalline silicon lightly-doped with appropriate background-type dopant. Substrate 12, can, for example, be a portion of a monocrystalline silicon wafer. To aid in interpretation of the claims that follow, the terms "semiconductive substrate" and "semiconductor substrate" are defined to mean any construction comprising semiconductive material, including, but not limited to, bulk semiconductive materials such as a semiconductive wafer (either alone or in assemblies comprising other materials thereon), and semiconductive material layers (either alone or in assemblies comprising other materials). The term "substrate" refers to any supporting structure, including, but not limited to, the semiconductive substrates described above.

A pair of vertically-extending pillars 14 and 16 are over the monocrystalline substrate 12, and supported by the substrate. Pillars 14 and 16 comprise semiconductor material 18. Such semiconductor material can be monocrystalline material epitaxially grown from a surface of substrate 12, polycrystalline material and/or amorphous material. In particular aspects, material 18 will comprise, consist essentially of, or consist of silicon.

The pillars 14 and 16 comprise sidewall and top surfaces, with the sidewall and top surface of pillar 14 being labeled 15 and 17, respectively; and the sidewall and top surface of pillar 16 being labeled 19 and 21, respectively.

A dielectric material 20 extends over substrate 12 and over pillars 14 and 16. Dielectric material 20 is ultimately utilized for spacing a gateline (discussed below) from the pillars, and can comprise any suitable material formed to any suitable thickness. In particular aspects, dielectric material 20 will comprise, consist essentially of, or consist of silicon dioxide formed to a thickness of less than or equal to about 50 Å. Dielectric material 20 can be formed by atomic layer deposition or chemical vapor deposition of an appropriate material, and/or can be formed by thermal oxidation of exposed surfaces of substrate 12 and pillar material 18.

Source/drain regions 22 are provided within substrate 12 proximate the bottom of pillar 14, and source/drain regions 24 are provided within substrate 12 proximate the bottom of pillar 16. Source/drain regions 22 and 24 can comprise any suitable composition, and typically will be heavily-doped with either n-type dopant or p-type dopant. The source/drain regions 22 and 24 can be identical in composition to one another, or can be different from one another. Also, although the pillars 14 and 16 are shown comprising the same material 18 as one another, it is to be understood that the pillars can, in other aspects (not shown) comprise different materials from one another.

Although it appears that two source/drain regions are formed adjacent each of the pillars in the shown cross-sectional view, it is to be understood that the source/drain regions may extend around the pillars when viewed from above. Accordingly, the apparent pair of source/drain regions 22 can be a single source/drain region extending entirely around pillar 14, and similarly the apparent pair of source/drain regions 24 can be a single source/drain region extending entirely around the pillar 16.

An isolation region 26 is shown provided between pillars 14 and 16. The isolation region is utilized to electrically isolate source/drain regions 22 from source/drain regions 24. Isolation region 26 can comprise any structure, such as, for example, a shallow trench isolation region. Although only one isolation region is shown, it is to be understood that other isolation regions can also be provided.

Although source/drain regions 22 and 24 are shown at the processing stage of FIG. 1, it is to be understood that the source/drain regions can be provided at other processing stages. Typically, the source/drain regions 22 and 24 will be provided after formation of pillars 14 and 16 so that the source/drain regions can be self-aligned relative to the pillars.

Pillars 14 and 16 would typically be part of a large array comprising a plurality of pillars. As discussed above, one of the problems in forming an array of pillars is that the pillars will typically not have identical heights across the array. Accordingly, even though pillars 14 and 16 are shown with approximately the same height as one another, it is to be understood that there can be other pillars present within an array comprising pillars 14 and 16 which have a different height than the pillars 14 and 16. For purposes of explaining the invention herein, it is useful to define a first elevational height as a height which is at or above the top surfaces 17 and 21 of the pillars. Such first elevational height is illustrated by the dashed line 28 in FIG. 1.

Referring next to FIG. 2, a gateline material 30 is formed over substrate 12 and over the pillars 14 and 16. The gateline material has an upper (or top) surface 31 which is at or above the first elevational height 28. The gateline material can be considered to be formed adjacent the pillars. The gateline material is formed in an orientation such that the gateline material can ultimately be constructed into gatelines controlling current flow through channels contained within the pillars, as will become apparent from the discussion below.

The gateline material 30 can comprise any suitable composition, and typically will comprise, consist essentially of, or consist of conductively-doped semiconductor material, such as, for example, silicon. In particular aspects, gateline 30 can comprise, consist essentially of, or consist of conductively-doped polycrystalline silicon and/or amorphous silicon. Gateline material 30 can also, or alternatively, comprise various metals and/or metal compositions. Although gateline material 30 is shown homogeneous in composition, it is to be understood that the gateline material can, in some aspects (not shown), comprise two or more separate layers which differ in composition relative to one another.

Referring to FIG. 3, gateline material 30 is patterned into a gateline structures 34 and 36 adjacent pillars 14 and 16, respectively. The patterning of the gateline material can be accomplished by, for example, photolithographic processing to form a suitable photoresist mask (not shown) over the gateline material 30, followed by an etch to transfer a pattern from the mask to the gateline material, and subsequent removal of the photoresist mask. Although the cross-sectional view of FIG. 3 shows what appear to be two gatelines 34 proximate pillar 14 and two gatelines 36 proximate pillar 16, it is to be understood that the shown gatelines 34 can surround pillar 14 and accordingly merge into one another to be part of a single gateline, and similarly the shown gatelines 36 can surround pillar 16 and accordingly merge with one another as part of a single gateline. Such is described in more detail below with reference to FIGS. 5 and 6.

The gateline material 30 has been recessed relative to pillars 14 and 16 so that upper surface 31 of the gateline material is now below the first elevational height 28.

Figure 4:
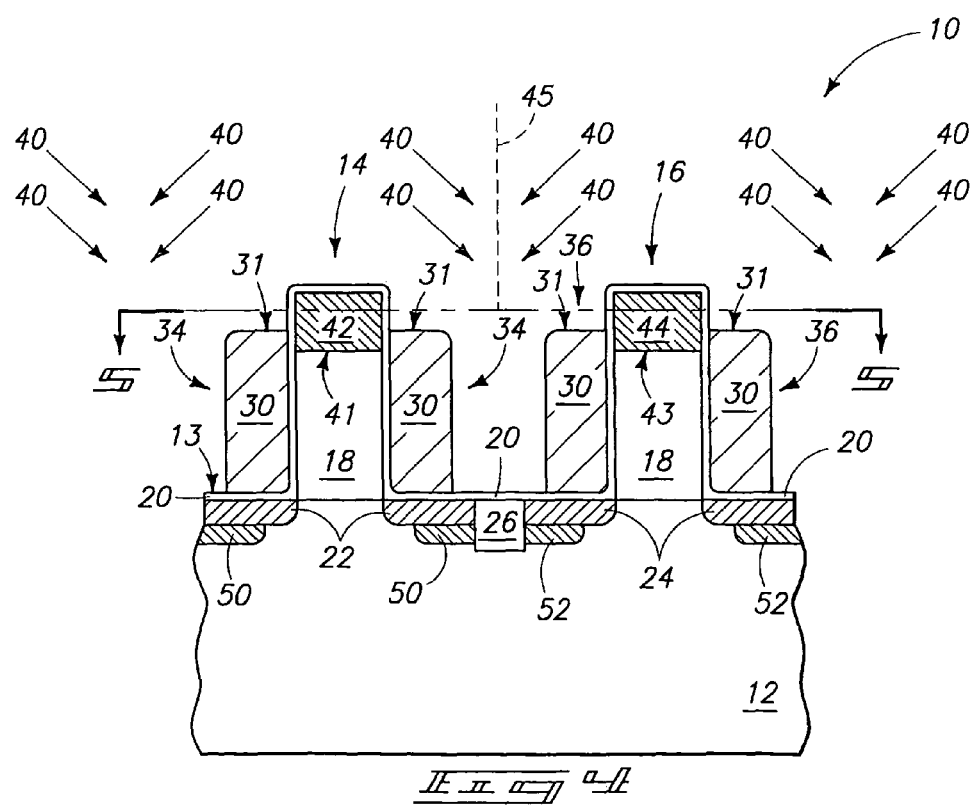
FIG. 4 is a view of the FIG. 1 fragment shown at a processing stage subsequent to that of FIG. 3.

Referring next to FIG. 4, dopant 40 is implanted into construction 10 at an angle to form source/drain implant regions 42 and 44 within the pillars 14 and 16, respectively. A vertical axis 45 is provided within FIG. 4, with the vertical direction of such axis being defined to be orthogonal to the horizontal axis defined by primary surface 13 of substrate 12. The angle at which dopant 40 is implanted into construction 10 is preferably at least 5° from vertical and in particular applications can be from about 5° to about 85° from vertical, from about 10° to about 60° from vertical, from about 20° to about 40° from vertical, and typically will be about 300 from vertical.

The angled implant effectively uses top surface 31 of gateline material 30 as a mask, and thus aligns bottom-most regions of source/drain regions 42 and 44 with the upper surface 31 of gateline material 30. Specifically, source/drain regions 42 and 44 have bottom-most locations 41 and 43, respectively, corresponding to the lowest level that dopant from the angled implant penetrates into pillar material 18 from the energy of the implant alone (it is noted that the dopant might migrate to regions below the shown bottom-most regions through thermal processing occurring subsequent to the implant of the dopant into the material 18).

The bottom-most level 41 of source/drain region 42 is preferably below upper surface 31 of gateline 34, but within 100 Å of the elevational height of the top surface 31 of gateline 34. Similarly, the bottom-most level 43 of source/drain region 44 is preferably below upper surface 31 of gateline 36, but within 100 Å of such upper surface of gateline 36. The angled implant of dopant 40 can be considered to form source/drain regions which are self-aligned relative to the upper surfaces of gatelines adjacent the source/drain regions.

The source/drain regions 42 and 44 can correspond to any type of source/drain region which is desired to be formed within the vertical pillars. In particular aspects, the source/drain region will correspond to lightly doped diffusion ($L_{DD}$) regions, and/or to halo regions. As is understood by persons of ordinary skill in the art, a transistor device will typically comprise heavily-doped portions of source/drain regions (typically understood as portions doped to a concentration of at least about $10^{19}$ atoms/cm$^3$ with conductivity-enhancing dopant) and more lightly doped portions of the regions. The heavily-doped regions can be either p-type or n-type, and the lightly doped regions will be referred to as halo regions if they have an opposite conductivity type relative to the heavily-doped regions, whereas the lightly doped regions will be referred to as $L_{DD}$ regions if they have the same conductivity type as the heavily doped regions.

In the aspect of the invention shown in FIG. 4, the angled implant of dopant 40 forms doped regions 50 and 52 within substrate 12 and beneath gatelines 34 and 36. Regions 50 and 52 can be referred to as source/drain implant regions formed within the semiconductor material of substrate 12. Regions 50 and 52 will be formed by the angled implant of dopant 40 if the spacing between adjacent gatelines 14 and 16 is large enough relative to the steepness of the implant of dopant 40 to allow the dopant to reach the substrate beyond the shadow of the upwardly-extending features. It is to be understood that the invention encompasses aspects in which dopant 40 is implanted too shallow relative to the spacing between the adjacent pillars 14 and 16 for the implant to reach substrate 12, in addition to the shown aspect in which the angled implant forms the source/drain implant regions within the substrate 12. Also, it is noted that even if full shadowing occurs, the angled implant can, in some aspects, dope the lower source/drain regions if it is done in four orientations of the wafer (for example, 0°, 90°, 180° and 270°).

As discussed previously, gatelines 34 and 36 may or may not entirely surround pillars 14 and 16. FIGS. 5 and 6 illustrate top views along the section 5-5 of FIG. 4 to show a pair of exemplary orientations of the gatelines relative to the pillars. Views of FIGS. 5 and 6 show the pillars 42 and 44 contained within an array which also comprises another pair of pillars 60 and 62. Each of the pillars comprises a lateral periphery. FIG. 5 illustrates a construction in which gateline 34 entirely surrounds the lateral periphery of pillar 42, and gateline 36 entirely surrounds the lateral periphery of pillar 44; and FIG. 6 illustrates a construction in which gateline 34 does not entirely surround the lateral periphery of pillar 42, and also in which gateline 36 does not entirely surround the lateral periphery of pillar 44.

Although the gatelines 34 and 36 are shown to be identical relative to one another, it is to be understood that the invention encompasses aspects in which the gatelines are different from one another. For instance, some of the pillars may be entirely laterally surrounded by gateline material while others of the pillars are not entirely laterally surrounded by gateline material.

The views of FIGS. 5 and 6 illustrate exemplary aspects by which gateline material can be provided adjacent pillars. It is to be understood that numerous other aspects can be utilized in conjunction with the methodologies of the present invention described herein.

Referring next to FIG. 7, construction 10 is illustrated at a processing stage subsequent to that of FIG. 4, and specifically is illustrated after heavily-doped source/drain regions 70 and 72 have been formed at the tops of pillars 14 and 16, respectively. The heavily-doped source/drain regions can be formed by any suitable methodology, including, for example, a vertical implant (i.e., an implant at approximately 0° relative to the vertical axis 45 of FIG. 4).

Although the heavily-doped source/drain regions are shown being formed after the FIG. 4 implant to form regions 42 and 44, it is to be understood that the heavily-doped regions can also be formed before and/or during the implant utilized to form regions 42 and 44. Also, although channel doping within pillars 14 and 16 was not discussed above, it is to be understood that there will typically be some channel doping of the pillars which would occur to, for example, form a threshold voltage ($V_t$) implant within the pillars. Such channel doping can occur at any suitable processing stage, including, for example, a processing stage prior to FIG. 2.

The doped regions 70 and 42 are electrically connected to the doped regions 22 and 50 through a vertical channel region within pillar 14 that is controlled by gateline 34. Accordingly, pillar 14 is comprised by a vertical transistor structure. Similarly, pillar 16 is comprised by a vertical transistor structure comprising a vertical channel between the source/drain regions at the top pillar 16 and the source/drain regions beneath gateline 36, with electrical current flow within such channel being controlled by gateline 36. The vertical transistor structures can be incorporated into numerous types of integrated circuitry. In an exemplary aspect, the vertical transistor structures are incorporated into DRAM devices. Specifically, source/drain regions 70 and 72 are electrically connected to charge storage structures (such as, for example, capacitors) 76 and 78, and source/drain regions 22 and 24 are electrically connected to bitlines 80 and 82, respectively. The dielectric material 20 is shown removed from over the top surfaces 17 and 21 of the pillars to accommodate electrical connection to the top of the pillars. Such removal can be accomplished by a suitable etch and/or planarization (such as, for example, chemical-mechanical polishing).

FIG. 8 illustrates another aspect of the invention which can follow the processing stage of FIG. 4. In referring to FIG. 8, similar numbering will be used as was utilized above in describing FIG. 7, where appropriate. The structure of FIG. 8 is similar to that of FIG. 7, except that FIG. 8 comprises conductive pillars 90 and 92 formed over the uppermost surfaces 17 and 21 of pillars 14 and 16, respectively. The pillars 90 and 92 are formed after removal of dielectric material 20 from over the uppermost surfaces 17 and 21 of pillars 14 and 16, and accordingly are in direct physical contact with (i.e., touch) the uppermost surfaces of the pillars 14 and 16. Conductive pillars 90 and 92 can comprise any suitable electrically conductive composition or combination of compositions. In particular aspects, the pillars 90 and 92 will comprise, consist essentially of, or consist of conductively-doped semiconductor material (such as, for example, conductively-doped silicon). In such aspects, heavily-doped source/drain regions 70 and 72 can be formed by out-diffusion of dopant from the conductive pillars 90 and 92.

The pillars 90 and 92 are shown electrically connected to the charge storage devices 76 and 78 discussed above, and accordingly are shown incorporated into DRAM devices in the exemplary construction of FIG. 8.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

The invention claimed is:

1. A method of forming a vertical transistor structure, comprising:
    providing a construction having a vertically-extending pillar over a monocrystalline substrate;
    first implanting first dopant to form a first source/drain implant region;
    after the implanting of the first dopant, providing a gateline over the substrate and adjacent the pillar;
    after the providing of the gateline, second implanting second dopant at an angle that is at least 5° from vertical to form a second source/drain implant region beneath the gateline and beneath the first source/drain implant region;
    wherein the first source/drain implant region is heavily doped; and
    wherein one of the first and second dopants is N-type and the other is P-type.

2. The method of claim 1 wherein the angle of the second implant is from about 20° to about 40°.

3. The method of claim 1 wherein the pillar has a lateral periphery, and wherein the gateline entirely surrounds the lateral periphery of the pillar.

4. The method of claim 1 wherein the pillar has a lateral periphery, and wherein the gateline does not entirely surround the lateral periphery of the pillar.

5. The method of claim 1 wherein the second implanting of the second dopant at the angle also forms a third heavily-doped source/drain region within the pillar adjacent a top surface of the gateline.

6. The method of claim 1 further comprising incorporating the transistor structure into a DRAM device.

7. The method of claim 1 wherein a bottom surface of the pillar physically contacts the monocrystalline substrate in a region of the monocrystalline substrate doped with a dopant of a type opposite the type of the second dopant implanted within the second source/drain implant region.

8. The method of claim 5 wherein the third source/drain region within the pillar is self-aligned to the gateline.

9. The method of claim 5 wherein during the second implanting, the gateline masks a portion of the pillar from the second implanting.

10. The method of claim 1 wherein the first source/drain implant region is in physical contact with portions of the substrate that are directly below the pillar.

11. The method of claim 1 wherein the first source/drain implant region is self-aligned to the pillar.

12. The method of claim 1 wherein an entirety of the gateline is directly above the first source/drain implant region.

13. A method of forming a vertical transistor structure, comprising:
    providing a monocrystalline substrate;
    epitaxially growing a semiconductive material over the substrate;

forming a vertically extending pillar from the semiconductive material;

first implanting a first dopant to form a first source/drain implant region in the substrate;

after the first implanting, providing a gateline over the substrate, over the first source/drain implant region and adjacent the pillar;

second implanting a second dopant at an angle that is at least 5° from vertical to form a second source/drain implant region beneath the gateline and a third source/drain region within the pillar adjacent a top surface of the gateline; and wherein a bottom surface of the pillar physically contacts the monocrystalline substrate in a region of the monocrystalline substrate doped with a dopant of a type opposite the type of the dopant implanted within the first source/drain implant region and wherein the third source/drain region extends elevationally above the top surface of the gateline and elevationally below the top surface of the gateline.

14. A method of forming a vertical transistor structure, comprising:

providing a construction having a vertically-extending pillar over a monocrystalline substrate;

first implanting first dopant to form a first source/drain implant region;

after the implanting of the first dopant, providing a gateline over the substrate and adjacent the pillar;

after the providing of the gateline, second implanting second dopant at an angle that is at least 5° from vertical to form a second source/drain implant region beneath the gateline and beneath the first source/drain implant region;

wherein the second implanting of the second dopant at the angle also forms a third heavily-doped source/drain region within the pillar adjacent a top surface of the gateline; and wherein the third heavily-doped source/drain region extends elevationally above the top surface of the gateline and elevationally below the top surface of the gateline.

* * * * *